(12) United States Patent
Pieralisi

(10) Patent No.: US 8,361,897 B2
(45) Date of Patent: Jan. 29, 2013

(54) METHOD FOR DEPOSITING A THIN FILM ELECTRODE AND THIN FILM STACK

(75) Inventor: Fabio Pieralisi, Aschaffenburg (DE)

(73) Assignee: Applied Materials, Inc., Santa Clara, CA (US)

( * ) Notice: Subject to any disclaimer, the term of this patent is extended or adjusted under 35 U.S.C. 154(b) by 29 days.

(21) Appl. No.: 12/939,855

(22) Filed: Nov. 4, 2010

(65) Prior Publication Data

US 2012/0104616 A1    May 3, 2012

(30) Foreign Application Priority Data

Oct. 29, 2010  (EP) .................................. 10189508

(51) Int. Cl.
*H01L 29/49* (2006.01)
(52) U.S. Cl. ........ 438/609; 257/762; 257/750; 257/763; 257/764; 257/E21.159; 257/E29.151
(58) Field of Classification Search .................. 257/762, 257/750, 763, 764, E21.159, E29.151; 438/609
See application file for complete search history.

(56) References Cited

U.S. PATENT DOCUMENTS

| 7,564,058 | B2 | 7/2009 | Yamazaki et al. | |
|---|---|---|---|---|
| 2008/0024055 | A1 | 1/2008 | Marks et al. | |
| 2009/0065771 | A1 | 3/2009 | Iwasaki et al. | |
| 2009/0084439 | A1 | 4/2009 | Lu et al. | |
| 2009/0120496 | A1 | 5/2009 | Cording et al. | |
| 2009/0227074 | A1* | 9/2009 | Hong et al. ................... | 438/149 |
| 2009/0297886 | A1 | 12/2009 | Gessert et al. | |
| 2010/0244031 | A1 | 9/2010 | Akimoto et al. | |
| 2010/0279475 | A1* | 11/2010 | Yamazaki et al. ............ | 438/158 |
| 2011/0039362 | A1* | 2/2011 | Long et al. ....................... | 438/34 |
| 2011/0073856 | A1* | 3/2011 | Sato et al. ........................ | 257/43 |

FOREIGN PATENT DOCUMENTS

| EP | 1184481 A2 | 3/2002 |
|---|---|---|
| WO | WO 2005091375 A1 | 9/2005 |

OTHER PUBLICATIONS

Extended European Search Report Mailed Apr. 26, 2011, in European Application Serial No. 10189508.4-1528.
Cheong, et al. "Metal-Doped Oxide Electrodes for Transparent Thin-Film Transistors Fabricated by Direct Co-Sputtering Method", 48 Japanese J. of App. Phys. 04C089 (2009).

* cited by examiner

*Primary Examiner* — Marc Armand
(74) *Attorney, Agent, or Firm* — Patterson & Sheridan, LLP

(57) ABSTRACT

A method for depositing at least one thin-film electrode onto a transparent conductive oxide film is provided. At first, the transparent conductive oxide film is deposited onto a substrate to be processed. Then, the substrate and the transparent conductive oxide film are subjected to a processing environment containing a processing gas acting as a donor material or an acceptor material with respect to the transparent conductive oxide film. The at least one thin-film electrode is deposited onto at least portions of the transparent conductive oxide film. A partial pressure of the processing gas acting as the donor material or the acceptor material with respect to the transparent conductive oxide film is varied while depositing the at least one thin-film electrode onto at least portions of the transparent conductive oxide film. Thus, a modified transparent conductive oxide film having reduced interface resistance and bulk resistance can be obtained.

9 Claims, 5 Drawing Sheets

METHOD FOR DEPOSITING A THIN FILM ELECTRODE AND THIN FILM STACK

TECHNICAL FIELD OF THE INVENTION

Embodiments of the present invention relate to a sputter deposition system for carrying out process steps for manufacturing transparent oxide thin-film transistors. In particular, embodiments of the present invention relate to a deposition apparatus adapted for depositing a thin-film electrode onto a transparent conductive oxide film suited for thin-film transistors. Furthermore, embodiments of the present invention relate to a thin-film stack adapted for use in a thin-film transistor. Moreover, embodiments of the present invention relate to a method for depositing a thin-film electrode onto a transparent conductive oxide film.

BACKGROUND OF THE INVENTION

Thin-film transistors (TFT) are widely used, e.g., as switching elements in display devices. Thin-film transistors may thus control a gray level in display technology and may drive a variety of display devices. In a conventional display device, a semiconductor element for driving each pixel is formed of a thin-film transistor having at least one active layer. Thin-film stacks for use in TFTs may include transparent conductive oxide (TCO) films that are deposited onto substrates. TCO films have wide applications, as these TCO films may be used for electronic devices such as liquid crystal displays, touch panel devices, photovoltaic cells, and transparent thin-film transistors. As thin-film transistors are of increasing importance in many electronic devices, it is an issue to improve their electric properties and device performances.

SUMMARY OF THE INVENTION

In light of the above, a method for depositing a thin-film electrode onto a transparent conductive oxide film in accordance with independent claim 1 is provided. Furthermore, a deposition apparatus adapted for depositing a thin-film electrode onto a transparent conductive oxide film in accordance with independent claim 7 is provided. In addition to that, a thin-film stack adapted for use in a thin-film transistor in accordance with independent claim 10 is provided.

According to one embodiment, a method for depositing a thin film electrode onto a transparent conductive oxide film is provided, the method including depositing the transparent conductive oxide film onto a substrate; subjecting the substrate and the transparent conductive oxide film to a processing environment containing a processing gas acting as a donor material or an acceptor material with respect to the transparent conductive oxide film; and depositing the thin film electrode onto at least portions of the transparent conductive oxide film, wherein a partial pressure of the processing gas acting as the donor material or the acceptor material with respect to the transparent conductive oxide film is varied while depositing the thin film electrode onto at least portions of the transparent conductive oxide film.

According to a further embodiment, a deposition apparatus adapted for depositing a thin film electrode onto a transparent conductive oxide film is provided, the deposition apparatus including a substrate carrier adapted for holding a substrate to be processed, a sputtering device adapted for sputtering the transparent conductive oxide film onto the substrate, and for sputtering at least one thin film electrode onto at least portions of the transparent conductive oxide film, and a gas flow controller adapted for controlling a composition of a processing environment of the substrate and the transparent conductive oxide film, the processing environment containing a processing gas acting as a donor material or an acceptor material with respect to the transparent conductive oxide film, wherein a partial pressure of the processing gas acting as the donor material or the acceptor material with respect to the transparent conductive oxide film is varied while depositing the thin film electrode onto at least portions of the transparent conductive oxide film.

According to yet a further embodiment, a thin film stack adapted for use in a thin film transistor is provided, the thin film stack including a substrate, a transparent conductive oxide film deposited onto the substrate, a precursor layer deposited onto the transparent conductive oxide film, and a thin film electrode deposited onto at least portions of the transparent conductive oxide film.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

BRIEF DESCRIPTION OF THE EMBODIMENTS

Figure 1:
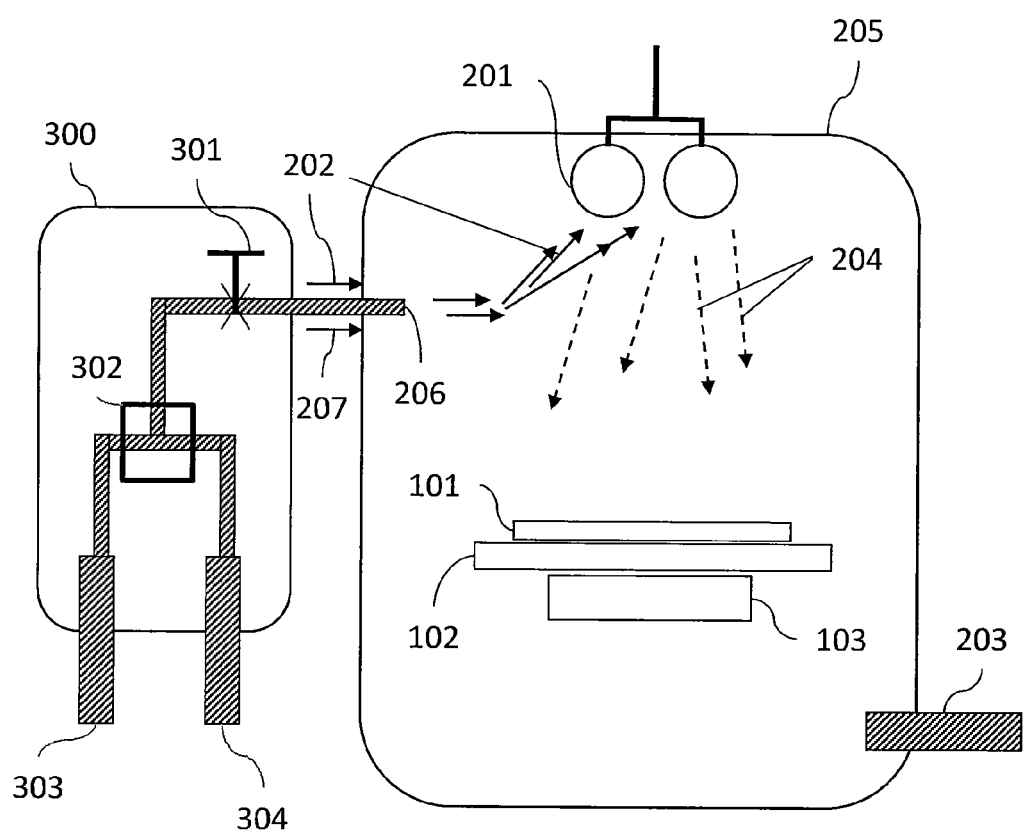
FIG. 1 is a schematic block diagram of a sputter deposition system in accordance with a typical embodiment.

Reference will now be made in detail to the various embodiments of the invention, one or more examples of which are illustrated in the figures. Within the following description of the drawings, the same reference numbers refer to the same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Embodiments described herein refer inter alia to a method for depositing a thin-film electrode onto a transparent conductive film. The transparent conductive oxide film is deposited over a transparent substrate, such as a glass substrate, and is then subjected to a processing environment which contains a processing gas acting as a donor material or an acceptor material with respect to the transparent conductive oxide film. When a thin-film electrode is deposited onto at least portions of the transparent conductive oxide film, a partial pressure of the processing gas acting as the donor material or the acceptor material with respect to the transparent conductive oxide film may be varied. Thus, a thin-film stack is obtained which may be used in a thin-film transistor.

The thin-film stack may include a substrate, a transparent conductive oxide film deposited onto the substrate, a precursor layer deposited onto the transparent conductive oxide film and a thin-film electrode deposited onto at least portions of the transparent conductive oxide film. In order to manufacture the thin-film stack for use in a thin-film transistor, a deposition apparatus may be provided which is adapted for depositing the thin-film electrode onto the transparent conductive oxide film. The deposition apparatus includes a substrate carrier which is adapted for holding the substrate to be processed.

A sputtering device is adapted for sputtering the transparent conductive oxide film over the substrate and for sputtering at least one thin-film electrode onto at least portions of the transparent conductive oxide film. A gas flow controller is adapted for controlling a composition of a processing environment of the substrate and the transparent conductive oxide film. The processing environment may contain a processing gas which acts as a donor material or an acceptor material with respect to the transparent conductive oxide film.

A partial pressure of the processing gas acting as the donor material or the acceptor material with respect to the transparent conductive oxide film may be varied while depositing the thin-film electrode onto at least portions of the transparent conductive oxide film. In order to provide good electrical properties of electronic thin-film devices, a reduced contact resistance between the transparent conductive oxide film and the at least one thin-film electrode must, therefore, be considered. In particular, a contact resistance between a semiconductor layer of the thin-film resistor and the respective source/drain layer coated onto it may be reduced. Thin-film transistor devices may thus exhibit an improved efficiency.

FIG. 1 is a schematic block diagram of a sputter deposition system 200 in accordance with a typical embodiment. As shown in FIG. 1, the sputter deposition system 200 includes a sputtering reactor 205 where a variety of thin films may be deposited over a substrate 101, and a gas flow controller 300. In the sputtering reactor 205, a substrate carrier 102 is arranged which is adapted to hold the substrate 101 to be processed.

The sputtering reactor 205 may further include a heating device 103 which is arranged adjacent to the substrate carrier 102 in order to heat up the substrate carrier 102 and the substrate 101 to a desired temperature. A sputtering target 201 providing deposition material 204 for forming the thin films onto the substrate 101 is arranged in the interior of the sputtering reactor 205. Sputtering gas 202, which is introduced into the sputtering reactor 205 via a sputtering gas inlet 206, sputters deposition material 204 off the sputtering target 201.

The sputtering system included in the sputtering reactor 205 may be formed of, but is not restricted to, a DC sputtering system, a RF sputtering system, or a magnetron sputtering system. The sputtering reactor 205 is connected to a vacuum pump 203 which may provide a desired internal pressure in the sputtering reactor 205. The sputtering gas 202 and a donor gas or an acceptor gas 207 are introduced into the sputtering reactor 205 via the sputtering gas inlet 206.

The sputtering gas 202 and the donor gas or acceptor gas 207 are provided by a gas flow controller 300. The gas flow controller 300 includes, amongst other things, a sputtering gas source 303 and a gas source 304 providing the donor gas or the acceptor gas 207. The sputtering gas source 303 and the gas source 304 are each connected via pipes to a gas mixer 302 which provides a mixture of sputtering gas 202 and donor or acceptor gas 207. It is noted here that the content of donor gas or the acceptor gas 207 in the sputtering gas 202 may be varied.

A gas valve 301 is included in the gas flow controller 300 in order to provide a desired gas flow of sputtering gas 202 and donor gas or acceptor gas 207 into the sputtering reactor 205. The sputtering device is adapted for sputtering at least one transparent conductive oxide film (TCO film) above the substrate 101 and for sputtering at least one thin-film electrode (described herein below with respect to FIGS. 2 and 3) onto at least portions of the transparent conductive oxide film.

The gas flow controller 300 provides a control of a composition of a processing environment surrounding the substrate 101 and the transparent conductive oxide film in the interior of the sputtering reactor 205. The processing environment contains the donor gas or acceptor gas 207, which acts as a donor material or an acceptor material with respect to the transparent conductive oxide film.

Figure 2:
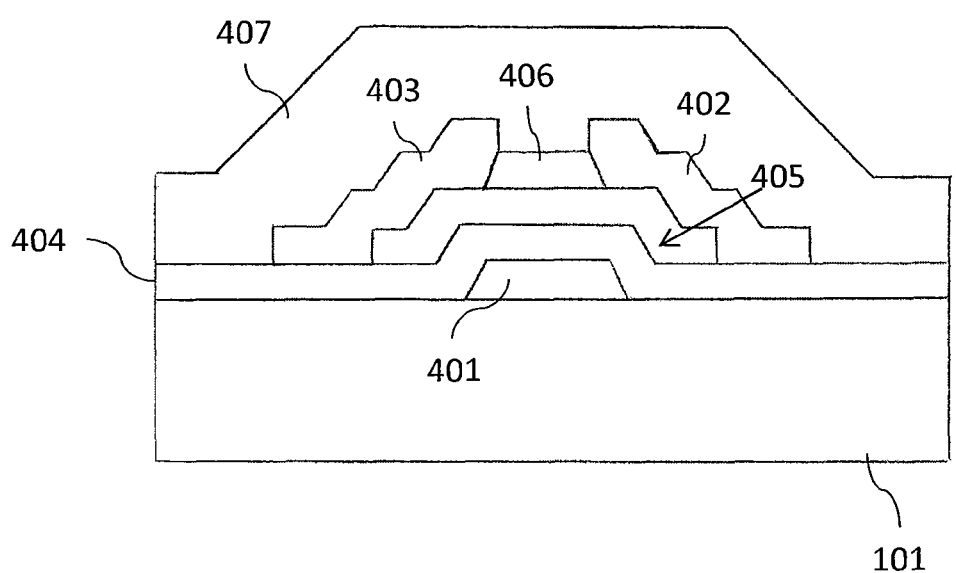
FIG. 2 is a side sectional view of a thin-film stack adapted for use in a thin-film transistor, according to another typical embodiment.
Figure 3:
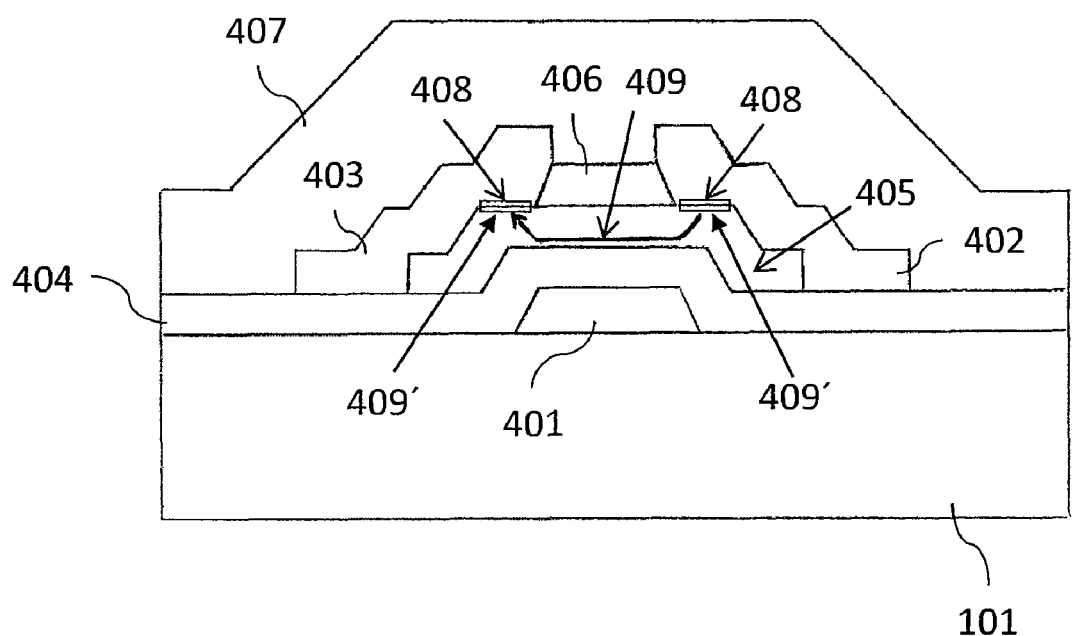
FIG. 3 is a side sectional view of a thin-film stack shown in FIG. 2, wherein the occurrence of interface and bulk resistances is shown.
Figure 4:
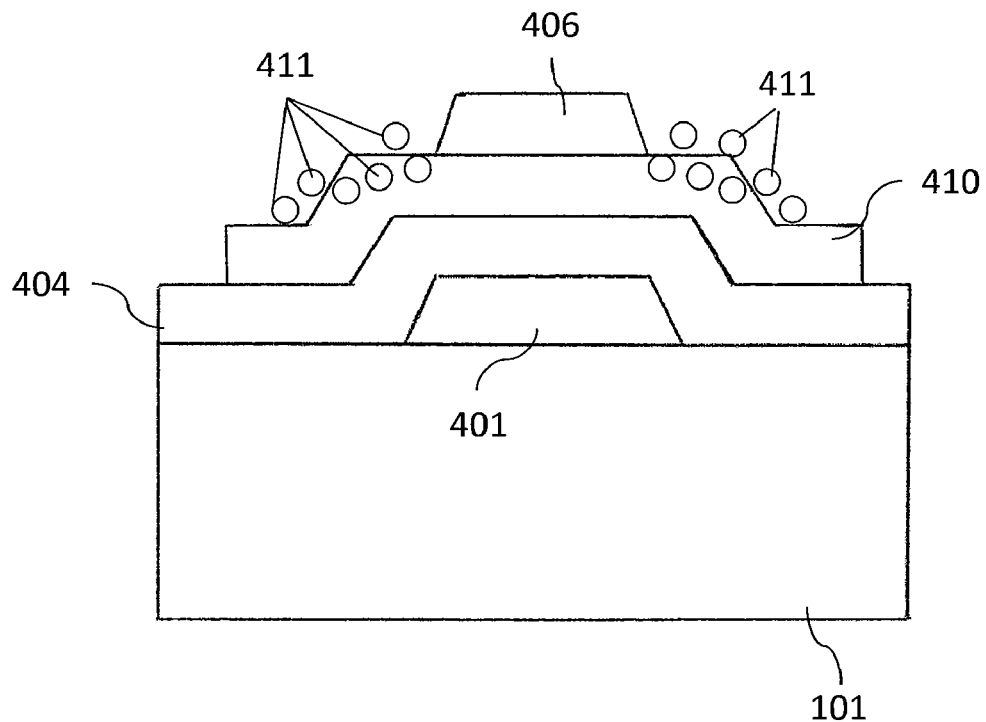
FIG. 4 is a side sectional view of a thin-film stack for illustrating gas incorporation into a transparent conductive oxide film, according to yet another typical embodiment.

The partial pressure of the processing gas which acts as the donor material or the acceptor material with respect to the transparent conductive oxide film, i.e., the donor gas or acceptor gas 207 may be varied with respect to the pressure of the sputtering gas 202, while the thin-film electrode is deposited onto at least portions of the transparent conductive oxide film (see also FIGS. 2, 3, and 4). It is noted here that the partial pressure of the processing gas acting as the donor material or the acceptor material with respect to the transparent conductive oxide film, i.e., the donor gas or the acceptor gas 207, may be expressed in terms of a flow ratio of gases which are introduced into the sputtering reactor 205. The flow ratio of the donor gas or the acceptor gas 207 with respect to the sputtering gas 202 may be varied in a range from 0.5% to 60%, and typically amounts to approximately 10%.

It is noted here, albeit not described in detail, that at least one deposition parameter may be controlled during the thin-film deposition process. The at least one deposition parameter may be selected from the group consisting of power applied at the sputtering cathodes (sputtering targets 201), a pressure of the sputtering gas 202, a composition of the deposition gas mixture, a substrate temperature, a deposition time and any combination thereof.

The processing environment may include a gas composition which is selected from the group consisting of Ar, $H_2$, Ar/$H_2$, $NH_3$, Ar/$NH_3$, $N_2$, Ar/$N_2$ and any combination thereof. The sputtering process may be provided by magnetron sputtering, RF-sputtering, or DC-sputtering and by reactive sputtering, or non-reactive sputtering. According to a typical embodiment which can be combined with other embodiments described herein, the sputtering deposition system 205 may be provided as a magnetron sputtering unit adapted for sputtering metal selected from the group consisting of Mo, Ti, MoTi, Al, Cu, and any combination thereof.

FIG. 2 is a side sectional view of a thin-film stack 100 including a number of layers on a substrate 101 to be processed. The thin-film stack 100, as shown in FIG. 2, may be part of a thin-film transistor in an inverted-staggered structure. The substrate 101 may be provided as a glass substrate. Onto the substrate 101, a gate contact 401 is deposited. The gate contact 401 and the remaining portion of the substrate surface are coated by a gate dielectric layer 404. Onto at least portions of the gate dielectric layer 404, a transparent conductive oxide film 405 (TCO film, TCO layer) is deposited. The transparent conductive oxide film 405 may include an n-type material selected from the group consisting of ZnO, IGZO, ITO, $In_2O_3$, $SnO_2$, CdO, and any combination thereof or a p-type material selected from the group consisting of $Cu_2O$, $CuAlO_2$, $Cu_2SrO_2$, $CuGaO_2$, and any combination thereof.

The coexistence of electrical conductivity and optical transparency in these materials may further depend on nature, number, and atomic arrangements of metal cations in crystalline or amorphous oxide structures, on the resident morphology, and on the presence of intrinsic or intentionally introduced defects.

Thin-film electrodes, such as a drain contact 402 and a source contact 403 are deposited onto at least portions of the transparent conductive oxide film 405. Between the source contact 403 and the drain contact 402, an etch stop layer 406 is located. For protection of the entire thin-film structure, a passivation layer 407 is deposited onto the entire thin-film structure.

According to another typical embodiment, which can be combined with other embodiments described herein, a precursor layer may be deposited onto the transparent conductive oxide film prior to depositing the thin-film electrodes 403, 402. The precursor layer may include sputtered metals selected from the group consisting of Mo, Ti, MoTi, Al, Cu, and any combination thereof. The thin-film electrodes, e.g., the drain contact 402 and the source contact 403 may include a material which is provided in form of sputtered metal selected from the group consisting of Mo, Ti, MoTi, Al, Cu, and any combination thereof.

FIG. 3 is another side sectional view of thin-film stack 100 according to a typical embodiment, wherein FIG. 3 exhibits the existence of the combination of a bulk resistance 409/409' and interface resistances 408. It is noted here, albeit not shown in the drawings, that the precursor layer is deposited prior to depositing the thin-film electrodes 403, 402, i.e., the source contact 403 and the drain contact 402.

According to a typical embodiment, which can be combined with other embodiments described herein, the precursor layer may have a thickness in a range from one atomic layer up to 100 nm, and typically has a thickness of approximately 10 nm.

The bulk resistance 409' below the drain/source electrodes indicated by two arrows in FIG. 3, may be reduced by providing a precursor layer which contains hydrogen. The hydrogen content may result in a carrier concentration of an n-type transparent conductive oxide film 405 of approximately $10^{19}$ atoms/cm$^3$. Moreover, the bulk resistance 409' below the drain/source electrodes indicated by two arrows in FIG. 3, may be reduced by providing a precursor layer which contains nitrogen. The nitrogen content may result in a carrier concentration of a p-type transparent conductive oxide film 405 of approximately $10^{19}$ atoms/cm$^3$. The entire resistance, e.g., the sum of the interface resistances 408 and the bulk resistance 409/409' is according to the following equation:

$$R_C = R_{interface} + R_{bulk} = R_{408} + R_{409} + R_{409'} \quad (1)$$

FIG. 4 is another side sectional view of a thin-film stack 100 according to yet a further embodiment which can be combined with other embodiments described herein. FIG. 4 shows the situation before depositing a thin-film electrode, e.g. the drain contact 402 and/or the source contact 403, onto the transparent conductive oxide film 405. Due to the combination of donor gas or the acceptor gas 207 and sputtering gas 202, which has been described herein above with respect to FIG. 1, at least a part of the donor gas or the acceptor gas 207 may be incorporated in a precursor layer prior to depositing the thin-film electrodes.

In FIG. 4, the substrate 101 to be processed is shown with layers of the gate contact 401, the gate dielectric layer 404 above the gate contact 401 and the remaining portions of the surface of the substrate 101 to be processed, a transparent conductive oxide film 410 which is modified by the incorporation of donor gas or acceptor gas 411 onto at least portions of the gate dielectric layer 404, and the etch stop layer 406 atop the modified transparent conductive oxide film 410. It is noted here that the portion of the transparent conductive oxide film 405 below the etch stop layer 406 is not modified by the donor gas or the acceptor gas 207.

It is noted here that the term "modified transparent conductive oxide film" indicates that a diffusion of donor gas or the acceptor gas 207 into the transparent conductive oxide film has occurred such that the bulk resistance 409' is reduced. The donor gas or the acceptor gas 207 which is contained in the processing environment in the sputtering reactor 205 (see FIG. 1) may act as a donor material or an acceptor material with respect to the transparent conductive oxide film 410.

As a donor material, hydrogen may be provided. Hydrogen gas, which is included as a donor gas 207 in the sputtering gas 202 introduced into the sputtering reactor 205 by means of the sputtering gas inlet 206, in addition to decreasing the bulk resistance 409', also decreases the interface resistance 408 of the interfaces between the transparent conductive oxide film 410 and the thin-film electrodes 403, 404 (not shown in FIG. 4). Thus, hydrogen gas is added to the sputtering process in order to generate a first few atomic layers of source/drain material with hydrogen content, wherein the remaining thin-film electrode is deposited without hydrogen in the sputter process gas until a set point value for the layer thickness has been reached.

As described above, the transparent conductive oxide film 405 may include n-type material selected from the group consisting of ZnO, IGZO, ITO, $In_2O_3$, $SnO_2$, CdO, and any combination thereof. As an alternative, the transparent conductive oxide film 405 may include p-type material selected from the group consisting of $Cu_2O$, $CuAlO_2$, $Cu_2SrO_2$, $CuGaO_2$, and any combination thereof. Particularly for the example, where $Cu_2O$ is used as a p-type TCO, which can be sued as a TFT active layer material, the above described processes can be applied by utilizing an nitrogen containing processing gases as acceptor gases, such as $N_2$, $N_2O$ or combinations thereof. Nitrogen is an effective p-type dopant for $Cu_2O$. Thus, providing a precursor layer creating acceptor states in the undoped $Cu_2O$ due to the nitrogen containing gas, can also improve the contact resistance.

Thus, the source/drain electrodes are not directly deposited onto the active channel island, but a precursor layer is provided between the transparent conductive oxide film 410 and the thin-film electrodes. Thus, hydrogen may act as a donor in transparent conductive oxide films 410 e.g. made from ZnO, IGZO, ITO, $In_2O_3$, $SnO_2$, CdO and any combination thereof, wherein a hydrogen incorporation during the sputtering process has an influence on the overall resistance according to equation (1) given herein above. Furthermore, nitrogen may act as an acceptor in transparent conductive oxide films 410 e.g. made from $Cu_2O$, $CuAlO_2$, $Cu_2SrO_2$, $CuGaO_2$, and any combination thereof, wherein a nitrogen incorporation during the sputtering process has an influence on the overall resistance according to equation (1) given herein above.

In this way, the overall resistance, i.e. the sum of the interface resistances 408 and the bulk resistance 409/409' may be reduced. Both the interface resistance 408 and the bulk resistance 409' may be reduced by sputtering metallization material in a hydrogen-containing atmosphere or in a nitrogen-containing atmosphere. The thin precursor layer may be deposited by static reactive magnetron sputtering of pure source/drain metal, such as Mo, Ti, MoTi, Al, Cu, or any combination thereof, wherein the deposition of the thin precursor layer is performed after a definition of the etch stop layer 406. An appropriate atmosphere for this process may be an $Ar/H_2$ or an $Ar/NH_3$ atmosphere for providing donor material with respect to n-type TCO films, or an $N_2$, $Ar/N_2$, $Ar/N_2O$ atmosphere for providing acceptor material with respect to p-type TCO films. Thus, hydrogen or nitrogen present in the sputtering atmosphere may reduce the interface resistances 408 between the transparent conductive oxide film 410 and the source/drain metallization which is sputtered directly above the precursor film, e.g., in a pure argon atmosphere.

In addition to that, the in situ $H_2$ diffusion allows reduction of the bulk resistance 409'. The extent of a reduction of the overall resistance Rc according to equation (1) given above may be provided by controlling different deposition parameters of the precursor film, such as power at the sputtering cathodes, pressure of the sputtering gas, composition of the argon/hydrogen or argon/nitrogen mixture, deposition time, substrate temperature, etc.

Figure 5:
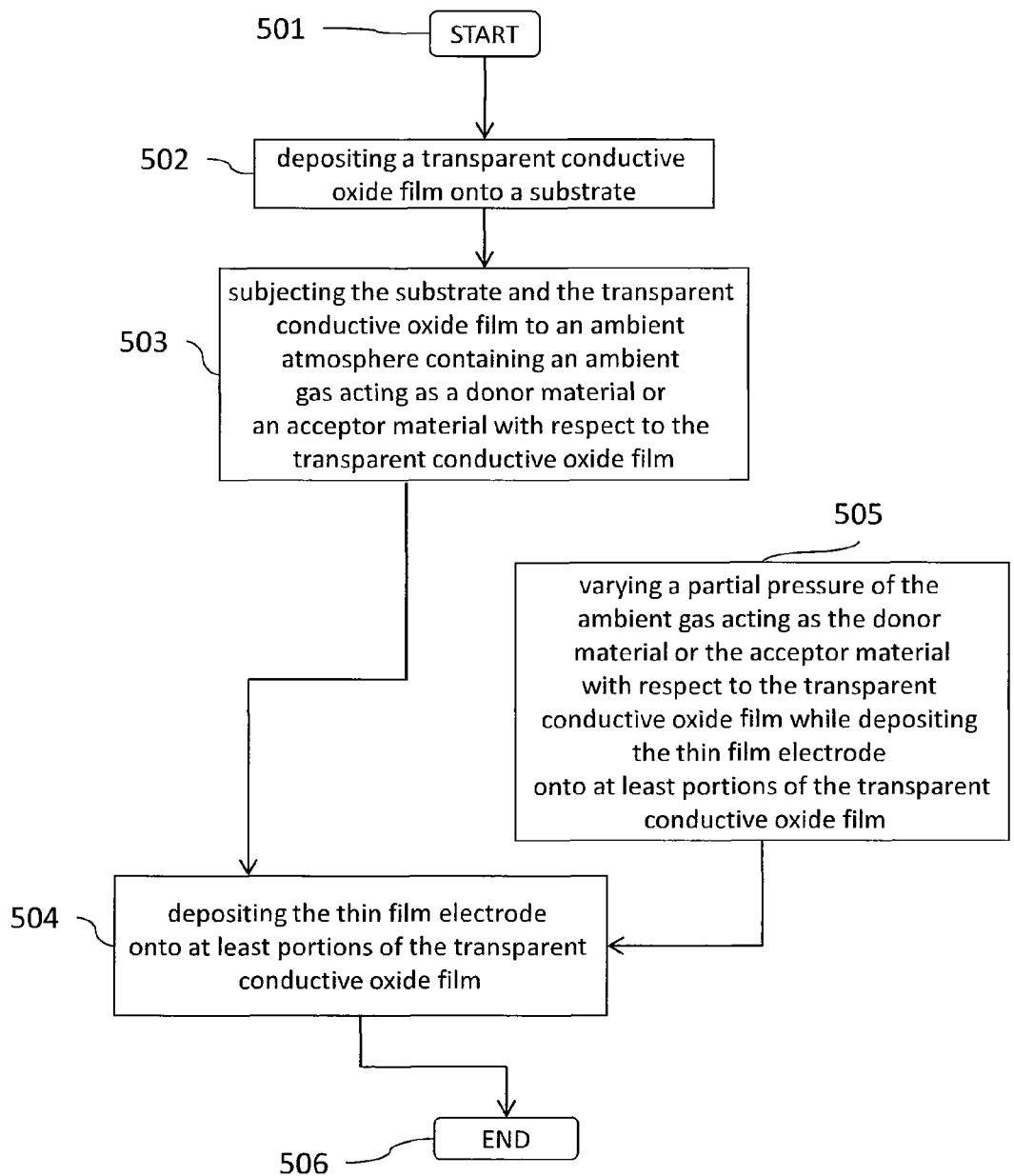
FIG. 5 is a flowchart illustrating a method for depositing a thin-film electrode for use in a thin-film transistor onto a transparent conductive film.

FIG. 5 is a flowchart illustrating a method for depositing a thin-film electrode onto a transparent conductive oxide film. The process starts at block 501. Then, a transparent conductive oxide film 405, 410 is deposited onto a substrate 101 (block 502). In block 503, the substrate and the transparent conductive oxide film deposited onto the substrate 101 are subjected to a processing environment containing a processing gas acting as a donor material or an acceptor material with respect to the transparent conductive oxide film 405.

Then, the thin-film electrode, e.g., the source contact 403 and the drain contact 402 are deposited onto at least portions of the transparent conductive oxide film 405. During deposition of the thin-film electrodes, a partial pressure of the processing gas acting as the donor material or the acceptor material with respect to the transparent conductive oxide film may be varied, as indicated by block 505. This variation of the partial pressure of the donor gas 207 is performed while depositing the thin-film electrodes 402, 403 onto at least portions of the transparent conductive oxide film 405. Thus, a modified transparent conductive oxide film 410 (see FIG. 4) is obtained which incorporates the donor material, e.g., hydrogen or the acceptor material, e.g. nitrogen. The procedure is ended at block 506.

In light of the above, a plurality of embodiments has been described. For example, according to one embodiment, a method for depositing a thin film electrode onto a transparent conductive oxide film is provided, the method including depositing the transparent conductive oxide film onto a substrate; subjecting the substrate and the transparent conductive oxide film to a processing environment containing a processing gas acting as a donor material or an acceptor material with respect to the transparent conductive oxide film; and depositing the thin film electrode onto at least portions of the transparent conductive oxide film, wherein a partial pressure of the processing gas acting as the donor material or the acceptor material with respect to the transparent conductive oxide film is varied while depositing the thin film electrode onto at least portions of the transparent conductive oxide film. The processing environment may include a gas composition which is selected from the group consisting of Ar, $H_2$, $Ar/H_2$, $NH_3$, $Ar/NH_3$, and any combination thereof or from the group consisting of: Ar, $N_2$, $Ar/N_2$, and any combination thereof.

According to yet further embodiments, which can be combined with any of the other embodiments and modifications above, the method may further include depositing a precursor layer onto the transparent conductive oxide film prior to depositing the thin film electrode. In addition to that, the precursor layer may be deposited by sputtering metal selected from the group consisting of Mo, Ti, MoTi, Al, Cu, and any combination thereof. According to yet further additional or alternative modifications at least one deposition parameter is controlled during the thin film deposition process, wherein the at least one deposition parameter is selected from the group consisting of power applied at sputtering cathodes, pressure of sputtering gas, composition of deposition gas mixture, substrate temperature, and any combination thereof. According to an optional modification thereof, the partial pressure of the processing gas acting as the donor material or the acceptor material with respect to the transparent conductive film is varied. A flow ratio of the donor gas with respect to the sputtering gas may be varied in a range from 0.5% to 60%, and typically amounts to approximately 10%.

According to another embodiment a deposition apparatus adapted for depositing a thin film electrode onto a transparent conductive oxide film is provided, the deposition apparatus including a substrate carrier adapted for holding a substrate to be processed, a sputtering device adapted for sputtering the transparent conductive oxide film onto the substrate and for sputtering at least one thin film electrode onto at least portions of the transparent conductive oxide film, and a gas flow controller adapted for controlling a composition of a processing environment of the substrate and the transparent conductive oxide film, the processing environment containing a processing gas acting as a donor material or an acceptor material with respect to the transparent conductive oxide film, wherein a partial pressure of the processing gas acting as the donor material or the acceptor material with respect to the transparent conductive oxide film is varied while depositing the thin film electrode onto at least portions of the transparent conductive oxide film.

According to yet further additional or alternative modifications the deposition apparatus may include a heating device adapted for heating the substrate to be processed. According to yet further embodiments, which can be combined with any of the other embodiments and modifications above, the sputtering device is provided as a magnetron sputtering unit adapted for sputtering metal selected from the group consisting of Mo, Ti, MoTi, Al, Cu, and any combination thereof. According to yet another embodiment, a thin film stack adapted for use in a thin film transistor is provided, the thin film stack including a substrate, a transparent conductive oxide film deposited onto the substrate, a precursor layer deposited onto the transparent conductive oxide film, and a thin film electrode deposited onto at least portions of the transparent conductive oxide film.

According to yet further embodiments, which can be combined with any of the other embodiments and modifications above, the transparent conductive oxide film may include an n-type material selected from the group consisting of ZnO, IGZO, ITO, $In_2O_3$, $SnO_2$, CdO, and any combination thereof or a p-type material selected from the group consisting of $Cu_2O$, $CuAlO_2$, $Cu_2SrO_2$, $CuGaO_2$, and any combination thereof. According to an optional modification thereof, the precursor layer includes sputtered metal selected from the group consisting of Mo, Ti, MoTi, Al, Cu, and any combination thereof. Furthermore, the precursor layer may have thickness which is in a range from one atomic layer to 100 nm, and typically has a thickness of approximately 10 nm.

According to yet further embodiments, which can be combined with any of the other embodiments and modifications above, a carrier concentration of one portion of the transparent conductive oxide film is in a range from $10^{17}$ atoms/$cm^3$ to $10^{20}$ atoms/$cm^3$ and typically amounts to approximately $10^{19}$ atoms/$cm^3$. A carrier concentration of another portion of the transparent conductive oxide film can be in a range from $10^{16}$ atoms/cm$^3$ to $10^{19}$ atoms/cm$^3$ and typically amounts to approximately $10^{18}$ atoms/cm$^3$. According to yet further additional or alternative modifications, the thin film electrode may include sputtered metal selected from the group consisting of Mo, Ti, MoTi, Al, Cu, and any combination thereof.

While the foregoing is directed to embodiments of the invention, other and further embodiments of the invention may be devised without departing from the basic scope thereof, and the scope thereof is determined by the claims that follow.

The invention claimed is:

1. A method for depositing a thin film electrode onto a transparent conductive oxide film, the method comprising:
   depositing the transparent conductive oxide film onto a substrate;
   subjecting the substrate and the transparent conductive oxide film to a processing environment containing a processing gas acting as a donor material or an acceptor material with respect to the transparent conductive oxide film; and
   depositing the thin film electrode onto at least portions of the transparent conductive oxide film, wherein
   a partial pressure of the processing gas acting as the donor material or the acceptor material with respect to the transparent conductive oxide film is varied while depositing the thin film electrode onto at least portions of the transparent conductive oxide film.

2. The method in accordance with claim 1, wherein the processing environment comprises a gas composition which is selected from the group consisting of Ar, $H_2$, Ar/$H_2$, $NH_3$, Ar/$NH_3$, and any combination thereof or wherein the processing environment comprises a gas composition which is selected from the group consisting of: Ar, $N_2$, Ar/$N_2$, Ar/$N_2O$ and any combination thereof.

3. The method in accordance with claim 1, further comprising depositing a precursor layer onto the transparent conductive oxide film prior to depositing the thin film electrode.

4. The method in accordance with claim 1, wherein at least one deposition parameter is controlled during the thin film deposition process, wherein the at least one deposition parameter is selected from the group consisting of power applied at sputtering cathodes, pressure of sputtering gas, composition of deposition gas mixture, substrate temperature, and any combination thereof.

5. The method in accordance with claim 1, wherein a flow ratio of the processing gas acting as the donor material or an acceptor material with respect to a sputtering gas is varied in a range from 0.5% to 60%, and typically amounts to approximately 10%.

6. The method in accordance with claim 3, wherein the precursor layer is deposited by sputtering a metal selected from the group consisting of Mo, Ti, MoTi, Al, Cu, and any combination thereof.

7. A deposition apparatus adapted for depositing a thin film electrode onto a transparent conductive oxide film, the deposition apparatus comprising:
   a substrate carrier adapted for holding a substrate to be processed;
   a sputtering device adapted for sputtering the transparent conductive oxide film onto the substrate and for sputtering at least one thin film electrode onto at least portions of the transparent conductive oxide film; and
   a gas flow controller adapted for controlling a composition of a processing environment of the substrate and the transparent conductive oxide film, the processing environment containing a processing gas acting as a donor material or an acceptor material with respect to the transparent conductive oxide film, wherein a partial pressure of the processing gas acting as the donor material or an acceptor material with respect to the transparent conductive oxide film is varied while depositing the thin film electrode onto at least portions of the transparent conductive oxide film.

8. The deposition apparatus in accordance with claim 7, further comprising a heating device adapted for heating the substrate to be processed.

9. The deposition apparatus in accordance with claim 7, wherein the sputtering device is provided as a magnetron sputtering unit adapted for sputtering metal selected from the group consisting of Mo, Ti, MoTi, Al, Cu, and any combination thereof.

* * * * *